United States Patent [19]

Awano

[11] Patent Number: 4,967,252
[45] Date of Patent: Oct. 30, 1990

[54] COMPOUND SEMICONDUCTOR BIPOLAR DEVICE WITH SIDE WALL CONTACT

[75] Inventor: Yuji Awano, Tokyo, Japan

[73] Assignee: 501 Fujitsu Limited, Kawasaki, Japan

[21] Appl. No.: 323,978

[22] Filed: Mar. 15, 1989

[30] Foreign Application Priority Data

Mar. 18, 1988 [JP] Japan .................................. 63-066212

[51] Int. Cl.⁵ .......................................... H01L 29/72
[52] U.S. Cl. ........................................ 357/34; 357/56; 357/16; 357/4
[58] Field of Search ................ 357/34, 34 HB, 16, 56, 357/4

[56] References Cited

U.S. PATENT DOCUMENTS

| 4,712,121 | 12/1987 | Yokoyama | 357/4 |
| 4,835,579 | 5/1989 | Ishibashi et al. | 357/16 X |

FOREIGN PATENT DOCUMENTS

| 0194497 | 9/1986 | European Pat. Off. | 357/34 |
| 61-154071 | 7/1986 | Japan | 357/34 |
| 61-296765 | 12/1986 | Japan | 357/34 |
| 0625659 | 1/1987 | Japan | |
| 0625660 | 1/1987 | Japan | |
| 62-85465 | 4/1987 | Japan | 357/34 |
| 0625658 | 7/1987 | Japan | |
| 63-48859 | 3/1988 | Japan | 357/34 |

OTHER PUBLICATIONS

Yokoyama et al., *Japanese Journal of Applied Physics*, "A New Functional Resonant-Tunnelling Hot Electron Transistor (RHET)", Nov. 1985, vol. 24, No. 11, pp. L853-L854.
Futatsuji et al., "A Resonant-Tunnelling Bipolar (RBT): A Proposal and Demonstration for New Functional Devices with High Current Gains," *IEEE Journal*, 1986, pp. 9-12.
Ahmed, "Balistic Electron Motion in GaAs At Room Temperature", *Electronics Letters*, vol. 16, No. 13, Jun. 13, 1980, pp. 524-525.
Naoki Yokoyama et al., "Japanese Journal of Applied Physics", *A New Functional, Resonant-Tunnelling Hot Electron Transistor (RHET)*, Nov. 1985, vol. 24, No. 11, pp. L853-L854.
T. Futatsuji et al., "IEEE Journal", *A Resonant-Tunnelling Bipolar (RBT): A Proposal and Demonstration for New Functional Devices with High Current Gains*, 1986, 9-12.
K. U. Ahmed, "Electronics Letters", *Ballistic Electron Motion in GaAs at Room Temperature*, vol. 16, No. 13, Jun. 13, 1980, pp. 524-525.

*Primary Examiner*—William Mintel
*Attorney, Agent, or Firm*—Staas & Halsey

[57] ABSTRACT

A high-speed compound semiconductor device includes semiconductor layers of a group III-V alloy laminated in a vertical direction. The device uses a base electrode that contacts side walls and covers a step portion of a base layer. The device includes an intermediate layer positioned between and comprising a different semiconductor material than that of base and collector layers. The intermediate layer has a different etching rate than those of the base and collector layers. The intermediate layer can be a collector-side barrier layer formed between the collector and base layers in a HET or RHET device. The device of the present invention has reduced capacitance between the base and collector layers and reduced base layer resistance.

19 Claims, 9 Drawing Sheets

COMPOUND SEMICONDUCTOR BIPOLAR DEVICE WITH SIDE WALL CONTACT

FIELD OF THE INVENTION

The present invention relates to a compound semiconductor device and to a method of manufacturing such a device. More particularly, the present invention relates to a device structure and a manufacturing method, wherein the device is specially intended for high-speed operation. The high-speed operation being attained by reducing the resistance of a base layer and the capacitance of a junction in a structure that uses a plurality of group III–V alloy semiconductor layers that are laminated vertically. The device structure of the present invention is widely applicable to devices such as HETs (Hot Electron Transistor), RHETs (Resonant-tunnelling Hot Electron Transistor), HBTs (Heterojunction Bipolar Transistor), RBTs (Resonant-tunnelling Bipolar Transistor), BET (Ballistic Electron Transistor).

DESCRIPTION OF THE RELATED ART

The above described devices have a general step structure. Therefore, lower semiconductor layers have a wider area than that of the upper layer. In such a structure an uppermost electrode is formed on a top portion of the device and other electrodes are formed on the steps at the peripheral region of the device.

The device structure described above has several disadvantages including a high junction capacitance between two active layers, especially between a base and collector layer; and high lateral resistance, especially along on the lower layers.

Figure 1:
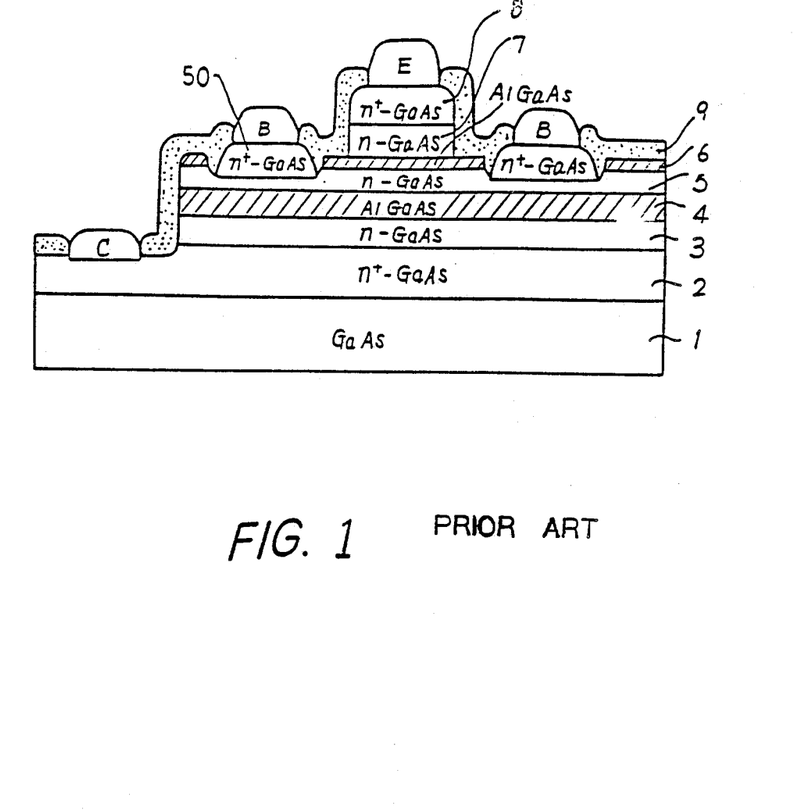
FIG. 1 is a schematic cross-sectional view of a prior art HET device.

The typical structure of a vertical prior art type semiconductor device is illustrated in FIG. 1, which is a schematic cross-section of a GaAs/AlGaAs HET (Hot Electron Transistor). The FIG. 1 semiconductor device comprises a GaAs (gallium-arsenic) substrate 1, an n+-GaAs collector contact layer 2, an n-GaAs collector layer 3, a non-doped AlGaAs (aluminum-gallium-arsenic) collector-side barrier layer 4, an n-GaAs base layer 5, a non-doped AlGaAs emitter-side barrier layer 6, an n-GaAs emitter layer 7, an n+-GaAs emitter contact layer 8, and a SiO$_2$ insulating layer 9. Each layer is laminated or formed successively on the substrate 1. The device further comprises an emitter electrode E, a base electrode B, and a collector electrode C.

In the structure of FIG. 1, the base electrode B is formed on an n+-GaAs contact layer 50 formed on the n-GaAs base layer 5. The entire bottom of the base layer 5 contacts the AlGaAs collector-side barrier layer 4. This results in a high capacitance $C_{bc}$ between the base layer 5 and collector layer 3. Also, because the base layer 5 is comparatively thin, it has a high base resistance $R_b$ in a lateral direction. The high capacitance $C_{bc}$ and high $R_b$ degrade the high-speed characteristic of a HET device.

SUMMARY OF THE INVENTION

It is an object of the invention to provide a high-speed semiconductor device in which a base layer resistance $R_b$ is made remarkably small.

It is another object of the invention to provide a high-speed semiconductor device in which a capacitance $C_{bc}$ between a base layer and collector layer is also reduced.

It is still another object of the invention to provide a method of manufacturing a high-speed semiconductor device with reduced base resistance and base-collector capacitance, the method being commonly applicable to various compound semiconductor devices.

To accomplish these and other objects, the compound semiconductor device of the present invention comprises a substrate; a first layer comprising at least a first compound semiconductor, and including a mesa having a top portion contact area; an intermediate layer contacting the contact area of the first layer and comprising a second compound semiconductor; a second layer having a top portion, side walls, having a bottom portion contacting the intermediate layer in a region overlying the contact area, and comprising at least the first semiconductor; an electrode contacting the side walls at a part of the top portion of the second layer; and a third layer overlying the second layer and comprising the first compound semiconductor.

The structure of the present invention results in a remarkably reduced base layer resistance $R_b$ and reduced capacitance $C_{bc}$.

The present invention also provides a method of fabricating a compound semiconductor device. The method includes forming a first layer of at least a first compound semiconductor on the substrate so as to form a mesa portion of the first layer, the mesa portion having a top area including a contact area; forming an intermediate layer of a second compound semiconductor on the contact area of the first layer; forming a second layer of at least the first compound semiconductor on a region of the intermediate layer overlying at least the contact area so as to form side walls and a top portion of the second layer; forming an electrode so as to contact the side walls and a part of the top portion of the second layer; and forming a third layer of the first compound semiconductor overlying the second layer.

As explained above, the compound semiconductor device of the present invention uses an intermediate layer between the base and collector layers. During fabrication this intermediate layer functions as an etch stopper. Applying the present invention to the HET shown in FIG. 1, the intermediate layer can be the collector-side barrier layer 4. In such a case, the layer 4 must comprise a different semiconductor material from that of the base and collector layers, and must have an etching characteristic, i.e., an etching speed (rate) that is different from that of the base and collector layers. The device of the present invention is fabricated using this difference in etching speed. The result is a metal base electrode formed directly on the base layer side walls and to cover the step portion thereof; and a remarkably reduced contact area between the base and collector layers.

The following Japanese Unexamined Patent Publications discuss reducing emitter capacitance and collector capacitance in a heterojunction bipolar transistor.

SHO-62-5658 dated Jan. 12, 1987 by K. Eda et al.
SHO-62-5659 dated Jan. 12, 1987 by K. Eda et al.
SHO-62-5660 dated Jan. 12, 1987by K. Eda et al.

An object of the present invention is to provide further improved device characteristics over the prior art.

BRIEF DESCRIPTION OF THE DRAWINGS

The present invention will be explained with reference to the drawings wherein like reference numerals identify the same or similar elements.

DETAILED DESCRIPTION OF THE PREFERRED EMBODIMENTS

(1) First Embodiment

Figure 2A:
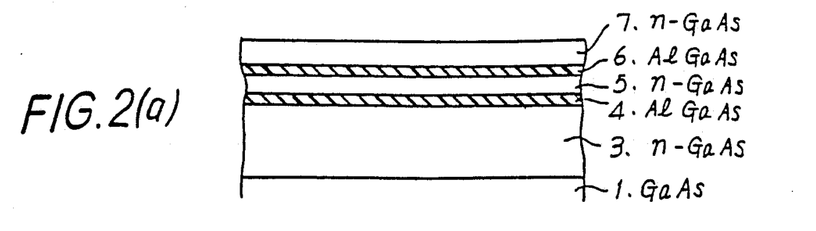
FIGS. 2(a) to 2(g) are schematic cross-sectional views of a HET at successive fabrication steps according to a first embodiment of the present invention.

A first embodiment of the present invention is explained using FIGS. 2(a) to 2(g). Each figure illustrates a schematic cross-section of a GaAs compound semiconductor HET device at a fabrication step. In FIG. 2(a), reference numeral 1 identifies a semi-insulating GaAs substrate An n-GaAs collector layer 3, an $Al_{0.3}Ga_{0.7}As$ an n-GaAs layer 5 collector-side barrier layer 4 an $Al_{0.3}Ga_{0.7}As$ emitter-side barrier layer 6, and an n-GaAs emitter layer 7 are grown one by one sequentially on the substrate 1. The collector-side barrier layer 4 and the emitter-side barrier layer 6, have a composition different from the compositions of the other layers, and have a energy band gap thereof that is higher than the energy band gap of the other layers. The layers 3–7 can be formed by, for example, a Molecular Beam Epitaxy (MBE) method or Metal Organic Chemical Vapor Deposition (MOCVD) method. The following table shows an example composition of the layers 3–7.

TABLE 1

| Reference Numeral | Composition | Dopant | Impurity Concentration $(cm^{-3})$ | Thickness (Å) |
| --- | --- | --- | --- | --- |
| 7 | n-GaAs | Si | $5 \times 10^{18}$ | 2000 |
| 6 | AlGaAs | — | — | 2000 |
| 5 | n-GaAs | Si | $5 \times 10^{18}$ | 500 |
| 4 | AlGaAs | — | — | 1500 |
| 3 | n-GaAs | Si | $5 \times 10^{18}$ | 10000 |

In a HET device typified by characteristics such as shown in Table 1, the collector-side barrier layer 4, which is comparatively thick, and can be conveniently utilized as the intermediate layer of the present invention.

Figure 2B:
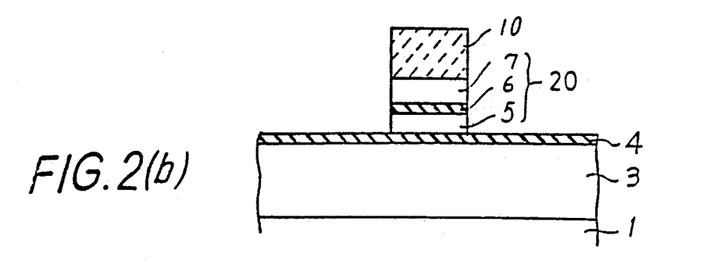

Next, the layer 7 is coated with a photo-resist layer that is subsequently patterned by a photo-lithography method to leave a pattern 10. Using the patterned resist layer 10 as a mask, the laminated layers 5–7 are sequentially subjected to an etching processes until the surface of the collector-side barrier layer 4 is exposed. This results in a mesa structure 20 comprising the base layer 5, the emitter-side barrier layer 6 and the emitter layer 7 under the resist mask 10 as shown in FIG. 2(b). Together, the layers 5 and 6 can be considered as a functional portion of the base layer 5.

In the above structure, the GaAs emitter layer 7 and GaAs base layer 5 can be etched by a selective dry etching method using a mixed gas of $CCl_2F_2$ (carbon dichlorodifluroide) and He (helium) as an etchant gas. The AlGaAs emitter-side barrier layer 6 can be etched by a wet etching method using an etchant solution such as $NH_4OH$—$H_2O_2$—$H_2O$. When the base layer 5 is subjected to the selective dry etching process, the collector-side barrier layer 4 functions as an etching stopper and is unaffected. This is because the dry etching process using $CCl_2F_2$ gas etches only the upper GaAs base layer 5.

Figure 2C:
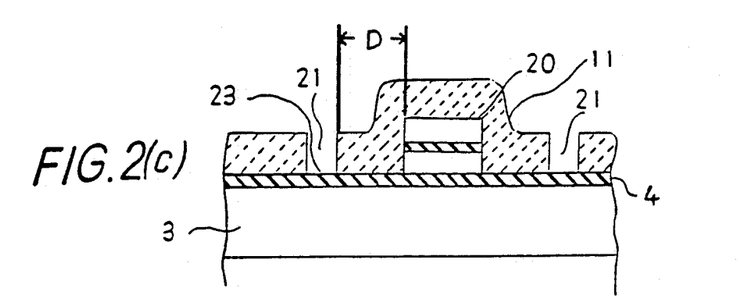

After removing the resist mask 10, the entire surface is coated with a resist layer 11. As shown in FIG. 2(c) an opening 21 is formed in the resist layer 11, to expose a surface portion 23 of the collector-side barrier 4. The opening 21 can be formed by any known technique such as a lithography technique. The opening 21 is formed a distance D from the mesa structure 20. The distance D is selected to provide a sufficient area for forming a base electrode. This distance D generally ranges from one to a several microns. The base electrode is, for example, formed in a lateral direction to surround the base layer 5 within the mesa structure 20.

The exposed portion 23 of the collector-side barrier layer 4 is then subjected to a wet etching process such as described above, using the patterned resist layer 11 as a mask. The exposed portion 23 of the AlGaAs collector-side barrier layer 4 is removed to expose a surface portion of the collector layer 3.

Figure 2D:
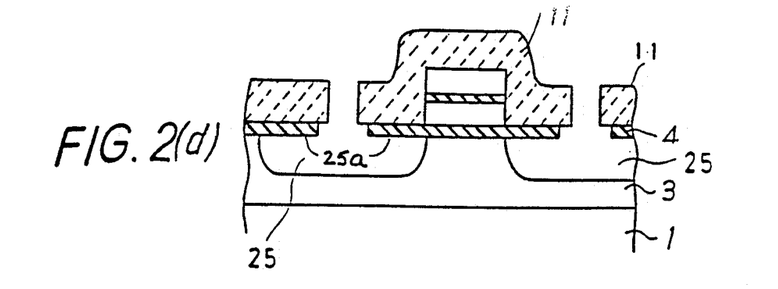

Thereafter, the substrate is subjected to a selective dry etching process such as described above. The GaAs layer 3 etches much faster than does the AlGaAs layer 4. Further, when the etching conditions for the GaAs layer are selected to be isotropic, the etching progresses in both a downward and a lateral direction to form a recess 25 as shown in FIG. 2(d). One example of isotropic etching conditions is the above dry etching procedure using a reactive ion etching method with a bias voltage of approximately 10 volts. Because, the etching rate of the AlGaAs layer 4 is very small compared to that of the GaAs layer 3, eaves 25a of the AlGaAs layer 4 with the resist mask 11 thereon are formed as shown in FIG. 2(d). As described below; a base electrode is formed on the eaves 25a.

The recess 25 contributes to reducing the contact area of the collector layer 3 facing the base layer 5. Preferably, this contact area is substantially equal to or less than a bottom surface of the base layer. This reduces the capacitance $C_{bc}$ between the base layer 5 and the collector layer 3.

Figure 2E:
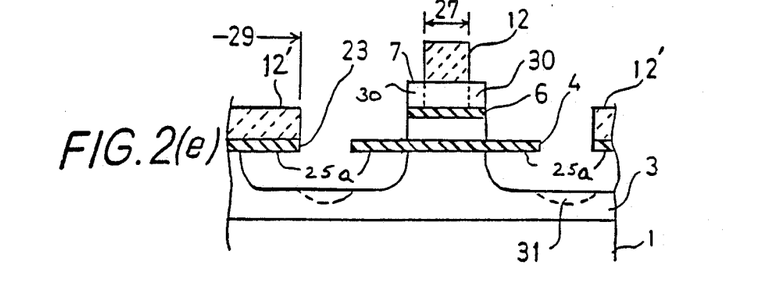

The remaining resist mask 11 is then removed, and the entire surface is coated with a new resist layer. This new resist layer is selectively patterned to form resist masks 12 and 12' as shown in FIG. 2(e). These resist masks are used to form an emitter region 27, and to form an exterior region 29 outside the opening 23. Because the collector-side barrier layer 4 is relatively thick, eaves 25a remain after etching.

Next, the emitter layer 7 is anisotropically etched using a dry etching process such as described above. Referring to FIG. 2(e), this etching removes exposed shoulder portion 30 of the emitter layer shown by a dashed line in FIG. 2(e). It is preferable to etch away the shoulder portion 30 of the emitter layer such that the remaining bottom area thereof is smaller than that of the top area of layer 6. As described above, because the collector-side barrier layer 4 and the emitter-side barrier layer 6 comprise AlGaAs, they are not etched during this dry etching process. However, the dry etching process does etch an n-GaAs collector layer portion 31 under the opening 23 to form a groove. This apparently does not have an important impact on the function of the collector layer 3.

Figure 2F:
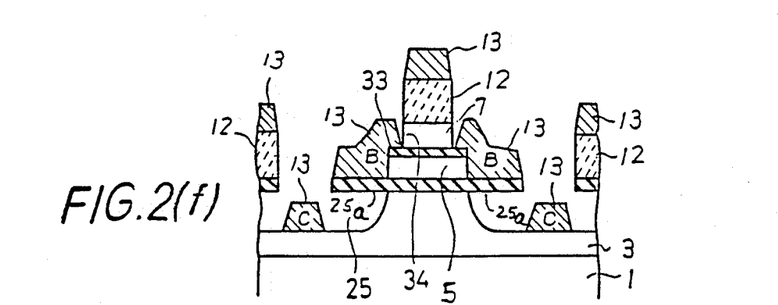

Thereafter the substrate is subjected to a sputtering process using a double metal such as AuGe and Au to form layer 13 such as shown in FIG. 2(f). The AuGe layer is first deposited to a thickness of 200 Å; and then the Au layer is deposited to a thickness of 2000 Å. The resist masks 12 and 12' and the deposited metal layer 13 thereon are removed by a lift-off process. The remaining deposited metal layer 13 forms a base electrode B and a collector electrode C. These electrodes are then thermally treated at about 400° C. and form an alloy with the semiconductor layer therebeneath. As seen in FIG. 2(f), the metal base electrode B contacts a side wall of the base layer 5 and extends laterally above the recess 25 and on the eaves portion of the collector-side barrier layer 4. Further the base electrode B also covers step portion 33 on the emitter-side barrier layer 6, but is isolated from the side wall 34 of the emitter layer 7. This structure of the base electrode B is very effective in reducing the base layer resistance $R_b$.

Figure 2G:
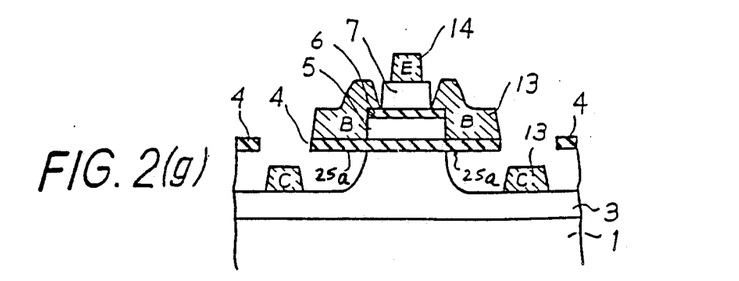

The entire surface of the device is again covered with a resist layer. This resist layer is patterned to form an opening on a forming area for an emitter electrode E (this process step is not shown in the figures). Thereafter, the device is subjected to a sputtering process using a double metal such as AuGe and Au to form layer 14 as shown in FIG. 2(g). A portion of the double metal layer formed on the resist layer is removed by a liftoff process. The substrate is then thermally processed so as to form an alloy of the metal layer 14 and the emitter layer 7; resulting in the emitter electrode E as shown in FIG. 2(g).

An insulating protective layer such as SiO2, SiN, or SiON is then formed on the entire device. Contact holes for electrodes E, B and C are then formed in the protective layer. Next a conductive layer such as aluminum is deposited and patterned to form connection wirings for a final device.

Figure 3A:
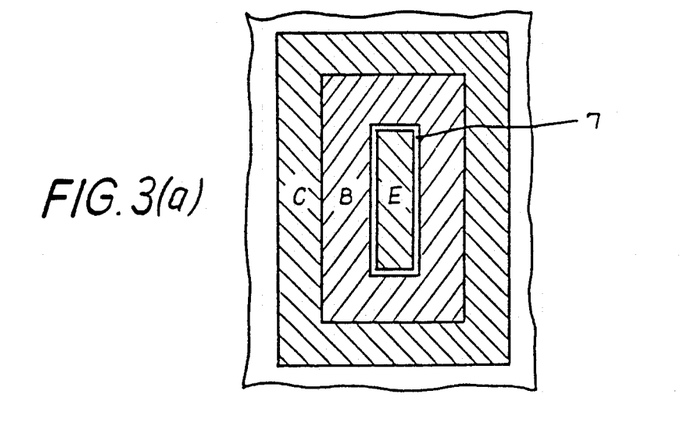
FIGS. 3(a) to 3(c) are schematic top views of a HET device according to the present invention.

In the above, the emitter electrode E is formed at the top of and in the center of the device, while the base electrode B and the collector electrode C are formed to surround the emitter electrode E as shown in FIG. 3(a). The present invention is not restricted to this type of structure, but is applicable to other structures such as shown in FIGS. 3(b) to 3(c).

Figure 3B:
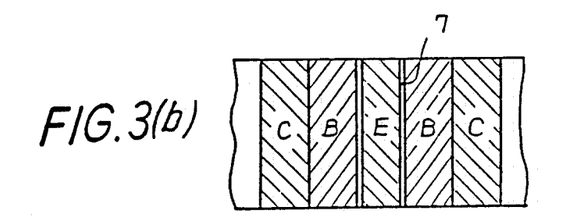
Figure 3C:
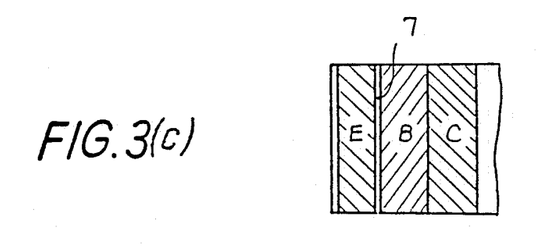

FIG. 3(b) is a schematic top view of a structure according to the present invention. In this structure, the base and collector electrodes B and C extend in only one direction, and are symmetrically arranged about the emitter electrode E. FIG. 3(c) is a schematic top view of a structure according to the present invention wherein the base and collector electrodes B and C are arranged on the same side of the emitter electrode E.

As explained with reference to FIGS. 2(e) and 2(f), the emitter layer 7 is formed using an etching process and the resist mask 12. The base electrode B is also formed using the resist mask 12. This means that the base electrode B is precisely formed and self-aligned with regard to the side walls of the emitter layer. The base electrode B also covers the step portion 33. This base electrode B shape greatly contributes to the reduction of the base layer resistance $R_b$.

The base collector capacitance $C_{bc}$ is expressed approximately by the following equation:

$$C_{bc} = e_0 \times e_s \times S_{bc}/d,$$

where $e$ denotes a dielectric constant of a vacuum; $e_s$ denotes a relative dielectric constant, in this case, of the collector-barrier layer 4; $S_{bc}$ denotes a contact area of the collector layer 3 with collector-side barrier layer 4; and d denotes a thickness of the collector-side barrier layer 4. According to the present invention, the contact area $S_{bc}$ is remarkably reduced compared with the contact area in the FIG. 1 structure. Other stray capacitances are also reduced by the present invention because of the recess 25.

In the first embodiment of the present invention, the collector contact layer 2 and emitter contact layer 8 shown in FIG. 1 are omitted because highly doped collector and emitter layers are used. Further, the collector-side barrier layer 4 of the HET device structure functions as an intermediate layer, and satisfies the fabrication condition that the intermediate layer must comprise a different material and have a different etching rate than the etching rates of adjacent layers.

The first embodiment of the present invention utilizes GaAs and AlGaAs semiconductor materials for the constituent layers of the HET device. These materials are not required by the present invention. For example, a similar HET device can be made using InGaAs emitter, base, and collector layers, an InAlAs (or quaternary semiconductor, InAlGaAs) for both barrier layers. These layers can be grown on and lattice-matched with an InP substrate. With these materials, wet etching can be performed by using a solution of HF+H2O2+H2O, and dry etching can be performed using a mixed gas comprising Cl2. InGaAs base and Collector layers can be dry etched, where the InAlAs (or InAlGaAs) layer functions as an etching stopper. The collector-side barrier layer can be wet etched.

(2) Second Embodiment

The second embodiment of the present invention is related to a RHET which is an improved type of HET device. The following references, which are incorporated by reference, discuss RHET devices.

"A New Functional, Resonant-Tunnelling Hot Electron Transistor (RHET)" by N. Yokoyama et al.: Japanese J. of Applied Physics, Vol. 11, Nov. 1985.

U.S. Pat. No. 4,712,121, issued on Dec. 8, 1987 to N. Yokoyama, and entitled "High-Speed Semiconductor Device."

The RHET structure disclosed in the above documents can be improved by an application of the present invention.

Figures 4A, 4B:
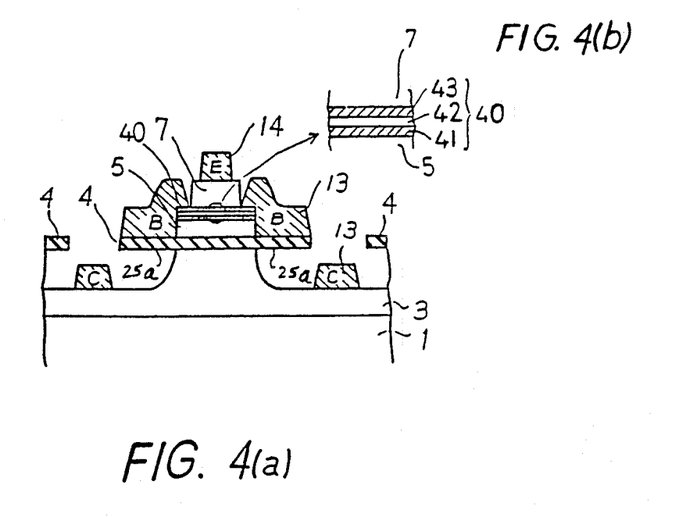
FIG. 4 is a schematic cross-sectional view of a RHET according to a second embodiment of the present invention.

FIG. 4 is a schematic cross-section of a RHET according to the second embodiment of the present invention. The basic structure is related to that of the HET device of FIG. 2(g). One difference is that the AlGaAs emitter-side barrier layer 6 (FIG. 2(g)) is replaced with a quantum well resonator 40 (FIG. 4). The quantum well resonator 40 comprises a non-doped AlAs or AlGaAs second barrier layer 41, a non-doped GaAs well layer 42, and a non-doped AlAs or AlGaAs layer first barrier layer 43. These layers respectively have typical thickness of about 50 Å, 56 Å, and 50 Å. The process for manufacturing a device according to the second embodiment of the present invention is almost the same as disclosed with regard to the first embodiment; and therefore, the details are omitted.

(3) Third Embodiment

The third embodiment of the present invention applies the present invention to a HBT. FIGS. 5(a) to 5(g) are cross-sectional views of various successive fabrication step according to the third embodiment of the present invention. FIG. 5(g) is a schematic cross-section of a completed HBT device according to the present invention. A semi-insulating GaAs substrate 1 is utilized. The device includes a first collector contact layer 51, a first intermediate layer 52, a second collector contact layer 53, a collector layer 3, a second intermediate layer 4, a base layer 5, an emitter layer 7, and an emitter contact layer 54 each grown on a substrate 1. The emitter layer 7 has a band gap that is higher than that of the base layer 5. The following table shows an example composition of the layers 3–7 and 51–54.

TABLE 2

| Reference Numeral | Composition | Dopant | Impurity Concentration (cm$^{-3}$) | Thickness (Å) |
|---|---|---|---|---|
| 54 | n-GaAs | Si | $5 \times 10^{18}$ | 1000 |
| 7 | n-AlGaAs | Si | $5 \times 10^{17}$ | 2000 |
| 5 | p-GaAs | Be | $7 \times 10^{18}$ | 800 |
| 4 | p-AlGaAs | Be | $7 \times 10^{18}$ | 5 to 10 |
| 3 | n-GaAs | Si | $5 \times 10^{16}$ | 3000 |
| 53 | n-GaAs | Si | $4 \times 10^{18}$ | 3000 |
| 52 | n-AlGaAs | Si | $4 \times 10^{18}$ | 20 |
| 51 | n-GaAs | Si | $4 \times 10^{18}$ | 50000 |

An HBT device does not require the thickness of collector-side barrier layer 4 as used with the first and second embodiments, and instead uses a relatively thin layer. In a HBT device according to the third embodiment of the present invention, the thin intermediate layer 4 is intentionally inserted between the collector layer 3 and the base layer 5. An intermediate layer 4 having a thickness of 5 to 10 Å is sufficient to obtain a selectivity in the etching process such as described with regard to FIGS. 2(a)–2(g).

Figure 5A:
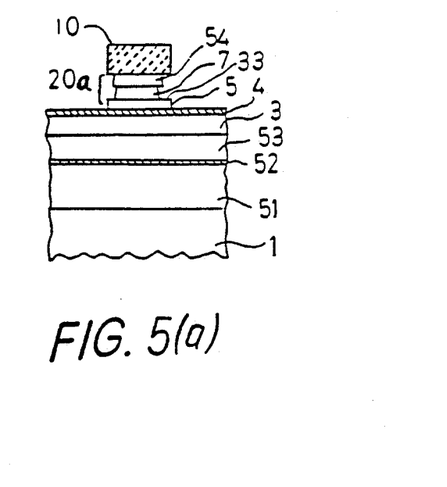
FIGS. 5(a) to 5(g) are schematic cross-sectional views of a HBT at successive fabrication steps according to a third embodiment of the present invention.

FIG. 5(a) is a cross-sectional view of an HBT according to the present invention after an etching step using a photoresist mask 10. A mesa structure 20 is similar to the mesa 20a shown in FIG. 2(b). Referring to FIG. 5(a), the n-GaAs emitter contact layer 54 is wet etched using a H$_3$PO$_4$/H$_2$O$_2$/H$_2$O solution, and the n-AlGaAs emitter layer 7 is wet etched using a H$_2$O$_2$/HCl solution. It is preferable to etch away the emitter layer 7 stronger so as to expose a step portion 33 of the base layer 5. The base layer 5 of p-GaAs is dry etched using CCl$_2$F$_2$ (carbon difluorodichloride) and He, as in the first embodiment. Although the p-type AlGaAs intermediate layer 4 is thin, it still functions as a etching stopper in order to protect the collector layer 3 from being etched away during the dry etching process.

Figure 5B:
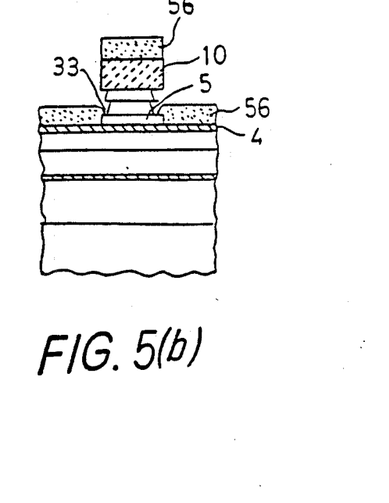

Unlike the first embodiment, in the FIG. 5(b) structure, the base electrode is formed before etching the second intermediate layer 4. This is because in the FIG. 5 structure, the intermediate layer 4 is thin and does not have enough mechanical strength to permit satisfactory formation of the eaves shown in FIG. 2(f). Referring to FIG. 5(b), the device is subjected to a sputtering process so as to form a composite metal layer 56 comprising TiPtAu. In the metal layer 56, Ti has a 200 Å thickness and contacts the layer 4 and the side walls of the base layer 6; Pt has a 500 Å thickness and is sandwiched between the Ti and Au; and Au has a 250 Å thickness.

The metal layer 56 contacts the side walls of the base layer 5 and covers the step portion 33 thereof. Because the base layer 5 comprises p-type GaAS, TiPtAu is used as the metal layer 56 in order to obtain good ohmic contact.

Figure 5C:
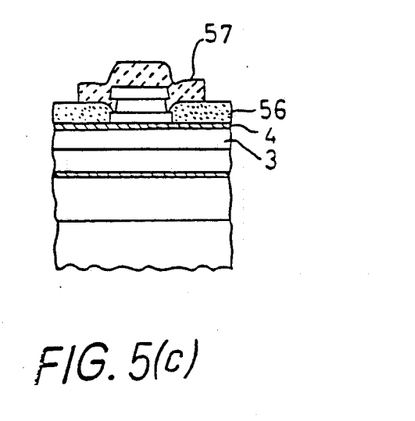
Figure 5D:
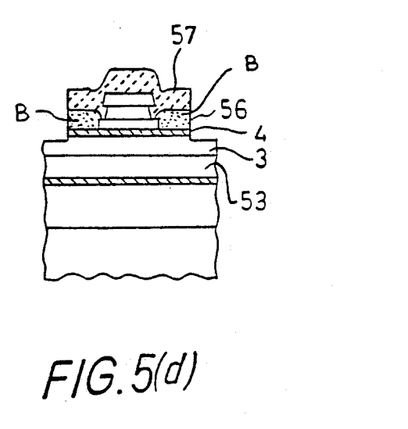

Next, the resist mask 10 is removed by a lift-off process; another resist layer is formed on the devices and this resist layer is patterned to form mask 57 as shown in FIG. 5(c). The device is then subjected to an ion-milling process that removes the exposed surfaces not covered by the resist mask 57, including portions of the metal layer 56, the second intermediate layer 4, and a portion of the collector layer 3 as shown in FIG. 5(d). The remaining portion of the metal layer 56 forms a base electrode B.

Figure 5E:
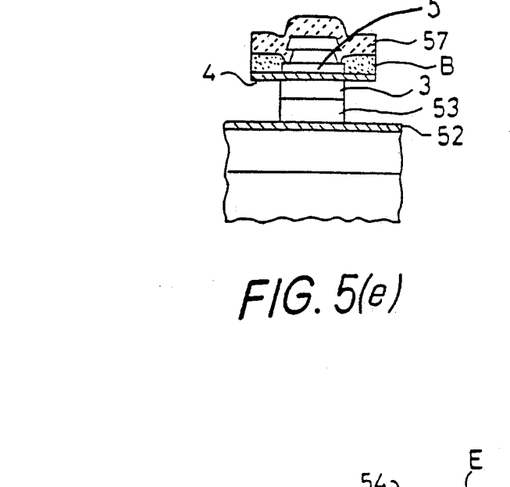

Referring to FIG. 5(e), the n-GaAs collector layer 3 and the n-GaAs second collector contact layer 53 are dry etching using CCl$_2$F$_2$. This etching proceeds both downwardly and laterally. The lateral etching reduces a contact area between the intermediate layer 4 and the collector layer 3 so that it is substantially equal to or less than a bottom area of the base layer 5. This etching does not affect the first intermediate layer 52 or the second intermediate layer 4; and thus, the base electrode B is not changed.

Figure 5F:
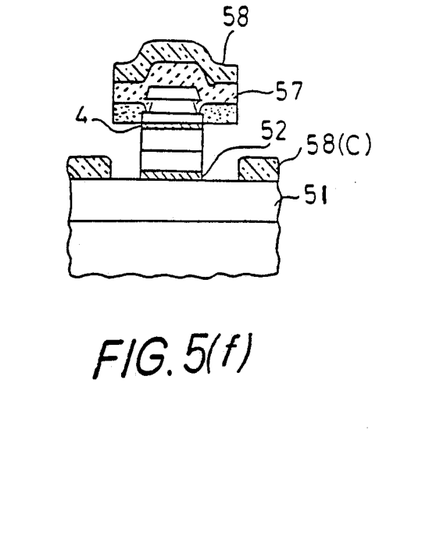
Figure 5G:
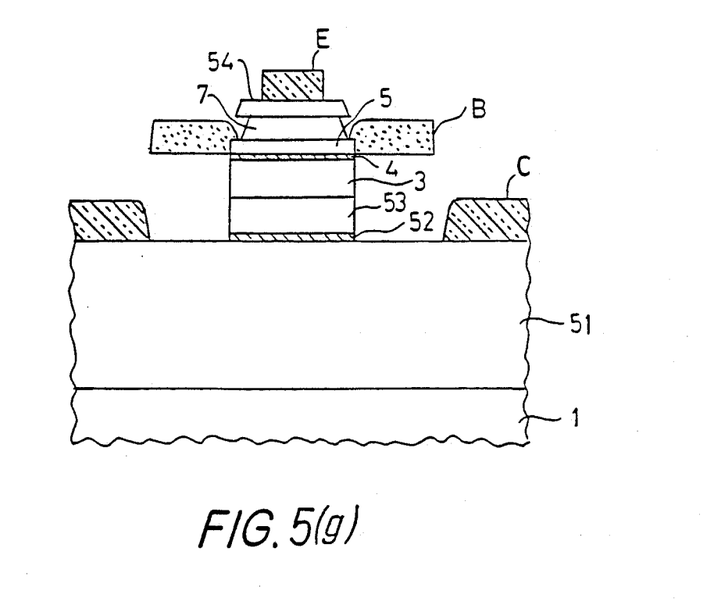

Next, referring to FIG. 5(f) the exposed surfaces of the n-AlGaAs first and second intermediate layers (52, 4) are wet etched using H$_2$O$_2$/HCL. A double metal layer 58 comprising AuGe/Au is then deposited on the device to form a collector electrode C. The resist mask 57 with the deposited metal layer 58 is finally removed by a lift-off proces, and an emitter electrode E is formed on the emitter contact layer 54. These steps can be performed in a manner similar to that discussed with respect to the first embodiment of the present invention. The resulting HBT device structure is shown in FIG. 5(g).

(4) Fourth Embodiment

The fourth embodiment of the present invention relates to a RBT device. The structure and operating principles of a RBT device are disclosed in the following document which is hereby incorporated by reference.

"A Resonant-tunnelling bipolar Transistor (RBT): A Proposal and Demonstration for New Functional Devices with High Current Gains" by T. Futasugi et al.: IDEM, 1986. The device structure disclosed in the above document can be improved by an application of the present invention.

Figure 6:
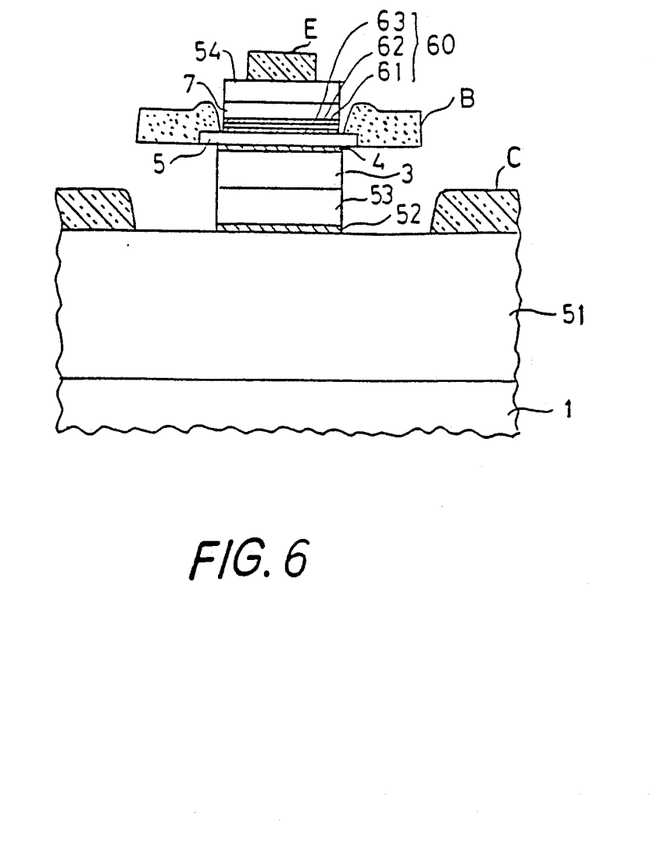
FIG. 6 is a schematic cross-sectional view of a RBT according to a fourth embodiment of the present invention.

FIG. 6 is a schematic cross-sectional view of a RBT device according to the present invention. This structure is very similar to that of the HBT (third embodiment) shown in FIG. 5(g) except that a quantum well resonator 60 is inserted between an emitter layer 7 and a base layer 5. The quantum well resonator 60 comprises three layers, for example, two barrier layers 61 and 63, and a single well layer 62 sandwiched therebetween. The barrier layers (61, 63) comprise non-doped AlAs and have a thickness of 20 Å. The well layer 62 comprises non-doped GaAs and has a thickness of 50 Å.

The HBT structural and compositional parameters disclosed in Table 2 can be used in fabricating the FIG. 6 device. To improve the performance of the resulting device, the impurity concentration of the base layer 5 and the collector layer 3 can be altered. For example the impurity concentration of p-GaAs layer 5 can be modified to $5\times10^{18}$ cm$^{-3}$, and that of n-GaAs layer 3 can be modified to $1\times10^{17}$ cm$^{-3}$. The remaining data of Table 2 can be used as shown. The method of manufacturing the FIG. 6 device is essentially the same as that for the FIG. 5 device. To fabricate the FIG. 6 device, however, the layers of the quantum well resonator 60 are formed, in a known manner, between the base layer 5 and the emitter layer 7.

(5) Fifth Embodiment

The present invention can be applied to a BET device. The structure and operation of a BET are disclosed in the following document, which is incorporated by reference.

"Ballistic Electron Motion in GaAs at Room Temperature" by L. F. Eastman et al: Electron Lett. 16, 524–525, 1980.

Figure 7A:
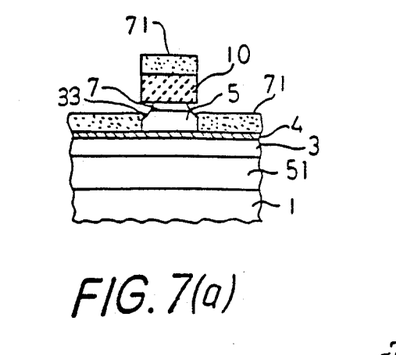
FIGS. 7(a) to 7(d) are schematic cross-sectional views of a BET at successive fabrication steps according to a fifth embodiment of the present invention.
Figure 7B:
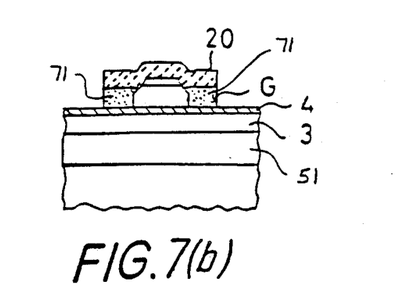
Figure 7C:
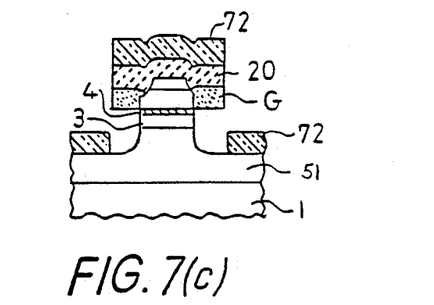
Figure 7D:
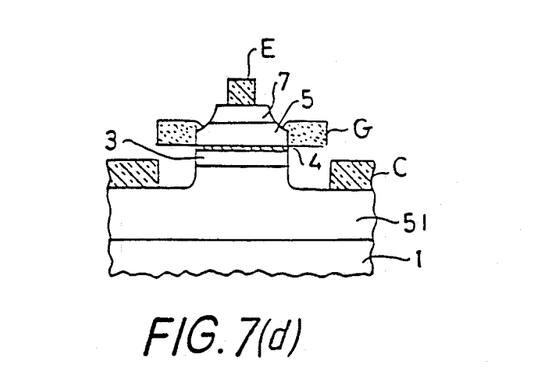

FIG. 7(d) is a schematic cross-sectional view of a completed BET according to the present invention. Table 3 shows an example composition of layers 3–7 and 51 of the FIG. 7 device.

TABLE 3

| Reference Numeral | Composition | Dopant | Impurity Concentration (cm$^{-3}$) | Thickness (Å) |
|---|---|---|---|---|
| 7 | n-GaAs | Si | $3\times10^{18}$ | 3000 |
| 5 | n-GaAs | Si | $1\times10^{16}$ | 1000 |
| 4 | n-AlGaAs | Si | $1\times10^{16}$ | 5 to 10 |
| 3 | N-GaAs | Si | $1\times10^{17}$ | 1000 |
| 51 | n-GaAs | Si | $3\times10^{18}$ | 50000 |

The fifth embodiment includes the intermediate layer 4 between the collector layer 3 and gate (base) layer 5. The process for manufacturing the FIG. 7(d) device is essentially the same as that for manufacturing the FIG. 5(g) device. The different portions of this process are discussed below.

FIG. 7(a) is a cross-sectional view of the RBT after deposition of an aluminum metal layer 71; and is similar to the cross-section shown in FIG. 5(b). The layer 71 functions as a gate electrode G. In forming the FIG. 7(a) structure, the n-GaAs emitter layer 7 and the n-GaAs gate layer 5, are first wet etched using H$_3$PO$_4$/H$_2$O$_2$/H$_2$O solution and then dry etched using a mixed gas of CCl$_2$F$_2$ and He. This etching forms a curved outer surface of the mesa comprising layers 5 and 7 as shown in FIG. 7(a). The curved surface includes a step portion 33 of the gate layer 7. The dry etching does not etch the n-AlGaAs intermediate layer 4. After the dry etching, a metal layer 71 is deposited on the device as shown in FIG. 7(a).

After the resist layer 10 is removed by a lift-off process, another resist layer is formed on the deice and this resist layer is patterned to form a mask 20 as shown in FIG. 7(b). The device is then subjected to an ionmilling process that removes the exposed surface of the metal layer 71 so as to form a gate (base) electrode G as shown in FIG. 7(b). The gate electrode G contacts the side wall of the gate layer 5 and covers the step portion 33 thereof.

Using the resist mask 20, the intermediate layer 4, the collector layer 3 and collector contact layer 51 are wet etched using H$_3$PO$_4$/H$_2$O$_2$/H$_2$O. This etching reduces a contact area between the collector layer 3 and the intermediate layer 4 so that the contact area is substantially equal to or less than a bottom area of the gate layer 5. After depositing a metal layer 72 comprising AuGe and Au on the device, a structure shown in FIG. 7(c) is obtained. This structure is similar to that shown in FIG. 5(f). The resist mask 20 is then removed by a lift-off process and the remaining portion of layer 72 forms a collector electrode C. An emitter electrode E is then formed by, for example, using a patterned resist layer and a metal layer including the emitter E, followed by lifting off the portion of the metal layer formed over the resist layer.

This invention may be practiced or embodied in still other ways without departing from the spirit or essential characteristics thereof. For instance, while in the disclosed preferred embodiments, the emitter layer is formed on a top portion of other layers such as the base layer and collector layer, the deposition order may be reversed such that the collector layer is formed at the top position of other layers, the emitter layer is formed at the bottom position and the intermediate layer of the present invention positioned between the emitter and base layers. Also, etching processes other than those described in the embodiments can be used. The necessary feature is that the layers are etched at different etching rates as discussed above. The preferred embodiments described herein are therefore illustrative and not restrictive.

We claim:

1. A compound semiconductor device structure comprising:
   a substrate;
   a first layer comprising at least a first compound semiconductor, and including a mesa with a top contact area;
   an intermediate layer contacting said contact area of said first layer and comprising a second compound semiconductor;
   a second layer having a top portion, side walls, having a bottom portion contacting said intermediate layer in a region overlying said contact area, and comprising at least said first compound semiconductor;
   an electrode contacting at least one of said side walls and extending laterally outside of said contact area; and
   a third layer overlying said second layer comprising said first compound semiconductor.

2. A compound semiconductor device structure according to claim 1, wherein said intermediate layer includes eaves extending outside of said contact area, and wherein said electrode contacts said eaves.

3. A compound semiconductor device structure according to claim 2, further comprising:
   another electrode contacting said first layer and being spaced from said mesa.

4. A compound semiconductor device structure according to claim 1, further comprising:
   another intermediate layer sandwiched between said second and said third layers.

5. A compound semiconductor device structure according to claim 4, wherein said another intermediate layer is structured as a quantum well resonator and comprises:
   a barrier layer formed in a lower portion of said another intermediate layer;
   another barrier layer formed in an upper portion of said another intermediate layer; a nd
   a well layer snadwiched between said barrier layer and said another barrier layer.

6. A compound semiconductor device structure according to claim 5, wherein said barrier layer and said another barrier layer comprise one of AlAs and AlGaAs, and wherein said well layer comprises GaAs.

7. A compound semiconductor device structure according to claim 6, wherein said intermediate layer includes eaves extending outside of said contact area, and wherein said electrode contacts said eaves.

8. A compound semiconductor device structure according to claim 7, further comprising:
another electrode contacting said first layer and being spaced from said mesa.

9. A compound semiconductor device structure according to claim 1, wherein said intermediate layer has an area corresponding to said contact area.

10. A compound semiconductor device structure according to claim 9, further comprising:
another electrode contacting said first layer and being spaced from said mesa.

11. A compound semiconductor device structure according to claim 1, wherein said first and said second layers have respective band gaps and said intermediate layer has a band gap being wider than said band gap of said first layer and of said second layer.

12. A compound semiconductor device structure according to claim 11, wherein said second and third layers have respective band gaps and said second layer includes a barrier portion of said second compound semiconductor, said barrier portion comprising said top portion of said second layer.

13. A compound semiconductor device structure according to claim 12, wherein said barrier portion has a wider band gap than said band gap of said second layer and said band gap of said third layer.

14. A compound semiconductor device structure according to claim 13, wherein said intermediate layer includes eaves extending outside of said contact area, and wherein said electrode contacts said eaves.

15. A compound semiconductor device structure according to claim 14, further comprising:
another electrode contacting said first layer and being spaced from said mesa.

16. A compound semiconductor device structure according to claim 13, wherein said intermediate layer has an area corresponding to said contact area.

17. A compound semiconductor device structure according to claim 16, further comprising:
another electrode contacting said first layer and being spaced from said mesa.

18. A compound semiconductor device structure according to claim 4, wherein said second and third layers have respective band gaps and said another intermediate layer comprises said second compound semiconductor.

19. A compound semiconductor device structure according to claim 18, wherein said another intermediate layer has a wider band gap than said band gap of said second layer and said band gap of said third layer.

* * * * *